(12) United States Patent
Adamec (10) Patent No.: US 6,614,026 B1
(45) Date of Patent: *Sep. 2, 2003

(54) CHARGED PARTICLE BEAM COLUMN

(75) Inventor: Pavel Adamec, Haar (DE)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/292,710

(22) Filed: Apr. 15, 1999

(51) Int. Cl.$^7$ ............................................. H01J 37/145
(52) U.S. Cl. ............. 250/398; 250/396 R; 250/396 ML
(58) Field of Search ..................... 250/398, 396 ML, 250/396 R (56) References Cited

U.S. PATENT DOCUMENTS

| | | | |
|---|---|---|---|
| 4,214,162 A | 7/1980 | Hoppe et al. | |
| 4,684,808 A | * 8/1987 | Plies et al. | 250/396 R |
| 4,710,639 A | * 12/1987 | Sawaragi | 250/398 |
| 4,962,313 A | * 10/1990 | Rose | 250/396 R |
| 4,983,832 A | 1/1991 | Sato | |
| 5,369,279 A | * 11/1994 | Martin | 250/396 ML |
| 5,986,269 A | * 11/1999 | Krijn et al. | 250/396 R |
| 6,066,853 A | * 5/2000 | Nakasuji | 250/398 |
| 6,452,175 B1 | * 9/2002 | Adamec | 250/310 |

FOREIGN PATENT DOCUMENTS

| | | |
|---|---|---|
| EP | 0 500 179 A1 | 8/1992 |
| EP | 1 049 131 A1 | 11/2000 |
| GB | 1 300 624 | 12/1972 |
| JP | 58-147948 A | 9/1983 |
| JP | 58-198842 A | 11/1983 |
| JP | 59-171445 A | 9/1984 |

* cited by examiner

*Primary Examiner*—Bruce Anderson
(74) *Attorney, Agent, or Firm*—Sughrue Mion, LLP.

(57) ABSTRACT

A column for directing a beam of charged particles with a finite energy spread onto a specimen surface under an oblique beam landing angle comprises: a particle source; an objective lens; a deflection unit for deflecting the beam of charged particles away from the optical axis such that the beam of charged particles traverses the objective lens off-axis, thereby causing a chromatic aberration, a compensation unit adapted to disperse the beam of charged particles, thereby substantially compensating said chromatic aberration in the plane of the specimen surface, whereby the combined action of the objective lens and the deflection unit directs the beam of charged particles to hit the specimen surface under said large beam landing angle.

15 Claims, 8 Drawing Sheets

CHARGED PARTICLE BEAM COLUMN

FIELD OF THE INVENTION

This invention relates to a charged particle beam column for the examination of specimen. In particular, this invention relates to a beam column where the beam may land on the specimen surface under an oblique landing angle.

BACKGROUND OF THE INVENTION

In charged particle beam devices, such as a scanning electron microscope (SEM) the typical aperture angle as well as the typical landing angle of the charged particle beam is of the order of several millirads. For many applications it is desirable that the charged particle beam lands on the sample surface under a much larger angle of typically 5° to 10°, corresponding to 90 to 180 millirads. Some uses require tilt angles in excess of 15° or even 20°.

One application which requires large landing angles is the stereoscopic visualization of a specimen surface. Stereographic techniques using a SEM date back to the early developmental period of scanning electron microscopy. Since electrons can be collected from practically all parts of a relatively rough sample, a SEM image has a rather "real" appearance. The main reason for this real appearance is that the secondary electron signal produced at the point of beam impact varies with the local slope of the surface in the same way as the perceived brightness of the surface of a diffusely illuminated macroscopic object. Furthermore, variations in the efficiency with which this signal is collected by the weak electric field from the detector modifies the signal as a function of position such that it appears as if the sample surface contained shadows. While the images have thus all the visual cues of a conventional black and white photograph, these cues are in many situations deceptive. It is therefore essential that a method which provides authentic perspective information is available. Stereoscopic visualization is such a method. It is useful and sometimes indispensable for detecting and resolving situations where other coding mechanisms yield ambiguous results.

In another application, topographical information about the specimen surface may be extracted, for example, from the parallax between stereo pairs of images obtained with a tilted beam. A further application, three-dimensional imaging of a specimen, requires also a beam tilted by several degrees, see, e.g., U.S. Pat. No. 5,734,164.

In all these applications, the beam tilting mechanism plays a key role. In early solutions, a stereo effect was achieved by mechanically tilting the specimen to provide two perspectives. However, due to mechanical imperfections, a lateral movement of the specimen is inevitable, which often results in misregistrations between the elements of a stereo image pair. This problem is especially pertinent for highly regular structures such as an array of memory cells in an integrated circuit.

When beam tilting is carried out electrically, the fact that the specimen can remain horizontally is a significant advantage as far as the lateral coordinate registration is concerned. Electrical tilting is also much faster than its mechanical counterpart. The electrical method, however, has also certain drawbacks. In one method, the beam is deflected above the objective lens (pre-lens deflection) in such a way that each ray seems to emerge from a point coincident with the apparent position of the electron source (see FIG. 3). This way, each ray is focussed on the same area of the sample as long as the sample surface is in focus. However, as a consequence, the beam traverses the field of the objective lens considerably off-axis with its attendant degradations due to lens aberrations. Especially chromatic aberrations limit the attainable resolution to several tens of nanometers. Many applications require a much higher resolution of about 5 nm.

Figure 3:
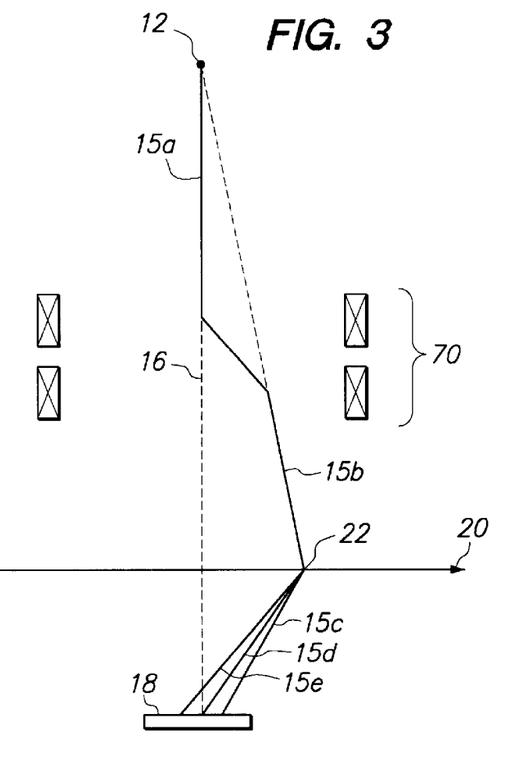
FIG. 3 is a schematic vertical cross section of a prior art beam column using a pre-lens deflection system.

If, as in another method, the deflection coils are arranged below the objective lens (post-lens deflection), the beam passes through the lens on the optical axis (FIG. 3). However, the physical dimensions of the coils below the final lens imposes a limit on the minimum attainable working distance, i.e., on the minimum attainable distance between the final lens and the specimen to be examined. An acceptable resolution is then not achieved due to the degraded instrument resolution arising from the enlarged working distance.

SUMMARY OF THE INVENTION

The present invention intends to overcome the above-mentioned drawbacks and disadvantages of the prior art. Specifically, the invention intends to provide an improved charged particle beam column allowing specimen to be examined with an obique beam landing angle while maintaining a high resolution of the charged particle image. According to one aspect of the present invention, to achieve this, there is provided a column as specified in claim 1 and a method as specified in claim 13.

Further advantageous features, aspects and details of the invention are evident from the dependent claims, the description and the accompanying drawings. The claims are intended to be understood as a first non-limiting approach to define the invention in general terms.

According to one aspect, the invention provides a column for directing a beam of charged particles with a finite energy spread onto a specimen surface under an oblique beam landing angle, the column comprising: a particle source for providing the beam of charged particles propagating along an optical axis; an objective lens for focussing the beam of charged particles onto the specimen surface; a deflection unit for deflecting the beam of charged particles away from the optical axis such that the beam of charged particles traverses the objective lens off-axis, thereby causing a chromatic aberration, a compensation unit adapted to disperse the beam of charged particles, thereby substantially compensating said chromatic aberration in the plane of the specimen surface, whereby the combined action of the objective lens and the deflection unit directs the beam of charged particles to hit the specimen surface under said oblique beam landing angle.

As discussed hereinbefore, the deflection leads to an off-axis path of the beam through the objective lens which gives rise to large chromatic aberrations due to the finite energy spread of the beam. It has surprisingly been found by the present inventors that this first chromatic aberration caused by the deflection can be compensated in the plane of the specimen surface by adding an element which introduces a second chromatic aberration of substantially the same kind and magnitude as the first chromatic aberration but which is substantially in the opposite direction. Such a second chromatic aberration may be introduced by dispersing the beam of charged particles.

In a preferred embodiment the compensating element comprises means for generating crossed electrostatic and magnetic deflection fields. Preferably, the crossed electrostatic and magnetic fields are created substantially perpendicular to the optical axis and form a so-called Wien filter.

The compensation unit is advantageously in the form of an electrostatic and magnetic multipole (2n-pole, with n=1, 2, 3 . . . ), preferably selected from the group consisting of electrostatic and magnetic dipole (2-pole), quadrupole (4-pole), hexapole (6-pole) and octupole (8-pole).

In a further preferred embodiment, the electrostatic and magnetic 2n-pole comprises 2n pole pieces and 2n electrodes which are distinct from said pole pieces. The pole pieces and the electrodes are arranged in a plane perpendicular to the optical axis. In a still further preferred embodiments, the electrostatic and magnetic 2n-pole comprises 2n pole pieces, wherein each of the 2n pole pieces is adapted to be used at the same time as an electrode. The pole pieces are arranged in a plane perpendicular to the optical axis.

Without being bound to a particular theory, the compensating effect of a Wien filter in the column is presently understood as follows:

For a certain beam landing angle, for example 5°, the necessary deflection causes the center of the beam to pass the objective lens at a certain distance from the optical axis. Then, the focal length of the objective lens depends on the energy of the charged particles and on the distance between the trajectory of the beam center and the optical axis. Since the beam of charged particles has a finite energy spread, particles with different energies are deflected by the lens in slightly different direction, causing the chromatic aberration of the lens (see FIG. 3).

In the Wien filter, the electric field E and the magnetic field B generate an electric and a magnetic force on the charged particles, $F_{el}=qE$, and $F_{mag}=q\,(v\times B)$, wherein $q=-e$ is the electron charge. If the electric and magnetic field are perpendicular to each other and to the velocity of the charged particle, the electric and magnetic forces are in opposite directions. For particles with a certain velocity, $v=|E|/|B|$, the net force is zero, and they pass the filter unaffected. Particles with a different speed experience a net force $F=|F_{el}-F_{mag}|$ and are deflected by the Wien filter. In effect, a beam of charged particles with a finite energy spread passing the Wien filter is dispersed, as particles with different energies are deflected by different amounts.

The dispersion leads to an at least partial compensation of the chromatic aberration of the objective lens. The invention has thus the advantage that large beam landing angles on the sample surface can be provided without the usual reduction in resolutions arising from large chromatic aberrations.

In the case where the compensation unit is formed by an electrostatic and magnetic 2n-pole with n being at least 2, both magnetic and electrostatic fields can be adjusted to deflect in an arbitrary direction in the plane perpendicular to the optical axis. Thereby, a compensation can be achieved for any direction of the deflecting action.

In the case where the compensation unit is formed by an electrostatic and magnetic 2n-pole with n being at least 3, more homogeneous deflection fields may be generated. This is especially important, if the fields are to be strong, if the beam diameter in the Wien filter is large, or if the charged particle beam is allowed to pass the filter off-axis. Additionally, higher order deflection fields can be generated which reduce or compensate the coma of the objective lens, which forms the second largest tilt aberration.

If the pole pieces are used at the same time as electrodes, electric and magnetic field with substantially identical spatial distribution are generated. The excellent matching of the fields is important when the deflection fields are to be very strong.

In a preferred embodiment, the deflection unit is adapted to provide a beam landing angle less than 25°, preferably between 3° and 15°, more preferable between 5° and 10°.

In a further preferred embodiment, the deflection unit comprises two deflectors adapted to deflect the beam of charged particle away from the optical axis to a path seeming to emerge from a point coincident with the apparent position of the particle source or, if applicable, to emerge from a point coincident with the apparent position of an intermediate image of the particle source.

In a still further preferred embodiment, the compensation unit is arranged between the particle source and the deflection unit. In certain cases it may be advantageous, to arrange the compensation unit within the deflection unit. Even though these two arrangement are preferred, it is also possible to arrange the compensation unit below the deflection unit.

Although the deflection system described so far can be used with any kind of objective lens, in a further aspect of the invention, the objective lens is a compound magnetic-electrostatic lens. Preferably, the electrostatic part of the compound magnetic-electrostatic lens is an electrostatic retarding lens. Using such a compound magnetic-electrostatic lens yields superior resolution at low acceleration energies, such as a few hundred electron volts in case of a SEM. Such low acceleration energies are desirable especially in modern semiconductor industry, to avoid charging and/or damaging of radiation sensitive specimens. In a preferred embodiment, the electrostatic retarding lens reduces the energy of a beam of electrons as charged particles to less then 5 keV, more preferably to less then 2 keV, most preferably to about or less than 1 keV.

According to an especially preferred aspect of the invention, the objective lens is a magnetic immersion lens.

In a preferred embodiment, the column comprises means for applying a potential difference between the specimen and a pole piece of the objective lens. An electrostatic retarding lens may thus be created between the specimen and a pole piece of the objective lens, without making additional electrodes necessary. The skilled person will appreciate, however, that additional electrodes may be present to supplement and/or modify the thus generated retarding field.

Preferably, the column further comprises means for scanning the beam of charged particles over the surface of the specimen.

The invention further comprises a method for directing a beam of charged particles with a finite energy spread onto a specimen surface under an oblique beam landing angle, the method comprising the steps of:

a) providing a beam of charged particles with a finite energy spread propagating along an optical axis;

b) focussing the beam of charges particles onto the specimen surface with an objective lens; whereby the method is characterized in further comprising the steps of c) selecting a beam landing angle;

d) deflecting the beam of charged particles propagating along the optical axis away from the optical axis such that the beam of charged particles traverses the objective lens off-axis, thereby causing a first chromatic aberration, whereby the magnitude of the deflection is chosen such that the combined action of deflecting and focussing the beam directs the beam of charged particles to hit the specimen under said large beam landing angle;

e) dispersing the beam of charged particles, thereby introducing a second chromatic aberration of substantially the same kind and magnitude but in substantially opposite direction as said first chromatic aberration to substantially compensate said first chromatic aberration in the plane of the specimen surface.

Preferably step e) of the method comprises: generating within a region along the optical axis crossed electrostatic and magnetic fields substantially perpendicular to the optical axis and to each other; and passing the beam of charged particles through said region.

BRIEF DESCRIPTION OF THE DRAWINGS

Some of the above indicated and other more detailed aspects of the invention will be described in the following description and partially illustrated with reference to the figures in which

FIG. 5b is a schematic vertical cross section of the Wien filter of FIG. 5a;

FIG. 6b is a schematic vertical cross section of the Wien filter of FIG. 6a;

In the figures, like reference numerals refer to like elements.

DESCRIPTION OF THE PREFERRED EMBODIMENTS

In the following, preferred embodiments of the invention are discussed which use electrons as charged particles. The invention is, however, not limited to the use of electrons but encompasses the use of protons, ions and other charged particles as well.

Figure 4:
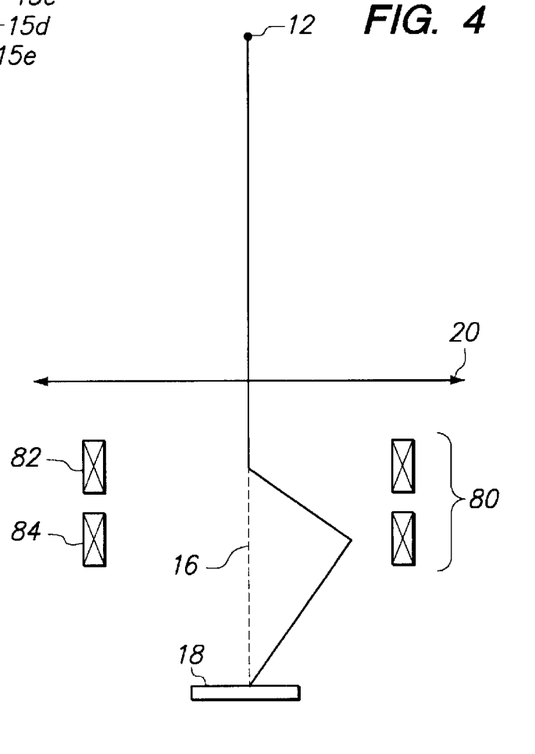
FIG. 4 is a schematic vertical cross section of a prior art beam column using a post-lens deflection system.

For a better understanding of the invention, typical problems associated with prior art designs in SEMs are illustrated in FIGS. 3 and 4. Elements such as the anode of the electron source, condenser lenses, apertures, scan coils, detectors and the like that are not important for understanding the present invention are omitted in the drawings. Generally, an electron beam is released from an electron source 12 and propagates along the optical axis 16 towards an objective lens 20.

The electrons in the beam are not monochromatic, but are emitted with slightly different energies. For example, in a thermionic electron gun, the energy spread (i.e., the full width at half maximum of the electron energy distribution) is of the order of $\Delta E=2.5\ kT_c$, where $T_c$ is the temperature of the cathode tip and k is Boltzmann's constant. This energy spread is further increased by the Boersch effect arising from space-charge oscillations near the crossover, so that thermionic tungsten cathodes show an energy spread of $\Delta E=1–3$ eV, while for $LaB_6$ cathodes the value is $\Delta E=0.5–2$ eV. Field emission guns usually have a lower energy spread due to the smaller cathode temperatures of the order of $\Delta E=0.2–0.4$ eV (L. Reimer, Scanning Electron Microscopy, Springer, 1985).

The objective lens 20 focuses the electron beam onto the surface of a specimen 18. The interaction of the electron beam with the specimen 18 generates secondary electrons which are collected and detected by a suitable detector (not shown).

In FIG. 3, a two-stage pre-lens deflection unit 70 deflects the beam from its path 15a along the optical axis 16 to a path 15b which seems to emerge from a point coincident with the apparent position of the particle source 12. That way the deflected beam is focussed by the objective lens 20 on the same area of the sample for any deflection as long as the sample surface is in focus (ray 15d). Due to the deflection, the beam traverses the field of the objective lens considerably off-axis (reference sign 22) leading to large chromatic aberrations arising from the finite energy spread of the beam.

For an on-axis beam, the finite energy spread of the beam results in a disk of least confusion with diameter $d_c$, which can be written as $$d_c = C_c \, \alpha \Delta E/E, \qquad (1)$$

where $C_c$ is the chromatic aberration coefficient, $\alpha$ is usually the convergence angle, and $\Delta E/E$ is the fractional variation in the electron-beam energy. Formula (1), which describes the chromatic aberration for an on-axis beam with convergence angle $\alpha$, can also be used to describe a situation where the charged particle beam passes the lens off-axis. In this case, the convergence angle $\alpha$ has to be replaced by the beam landing angle in equation (1) and the length $d_c$ is a lateral extension of the elongated beam cross section. A large chromatic aberration arises as the beam landing angle is very large (several degrees) compared to typical convergence angles (a few tenth of a degree).

The effect is schematically shown in FIG. 3 by rays 15e, 15d and 15c representing electrons with energies E–ΔE, E, and E+ΔE, respectively. As illustrated, electrons with higher energies are deflected less than electrons will lower energies. In designs as illustrated in FIG. 3, chromatic aberration blurs the image and limits the attainable resolution to several tens of nanometers.

FIG. 4 shows an alternative prior art design wherein deflection coils 82, 84 are arranged below the objective lens 20 to form a post-lens deflection system 80. After the beam passes through the objective lens 20, a first deflection coil 82 deflects the beam away from the optical axis and a second deflection coil 84 directs the beam back to the optical axis to hit the sample under the desired beam landing angle. As the beam passes the objective lens 20 on the optical axis 16, the resolution is not degraded by the off-axis aberration of the lens. However, the physical dimensions of the coils below the final lens 20 imposes a limit on the minimum working distance attainable, requiring objective lenses with larger focal lengths. The larger focal length then gives rise to increased chromatic as well as to increased spherical aberrations. Accordingly, solutions as illustrated in FIG. 4, do also not achieve acceptable image resolutions.

Figure 1:
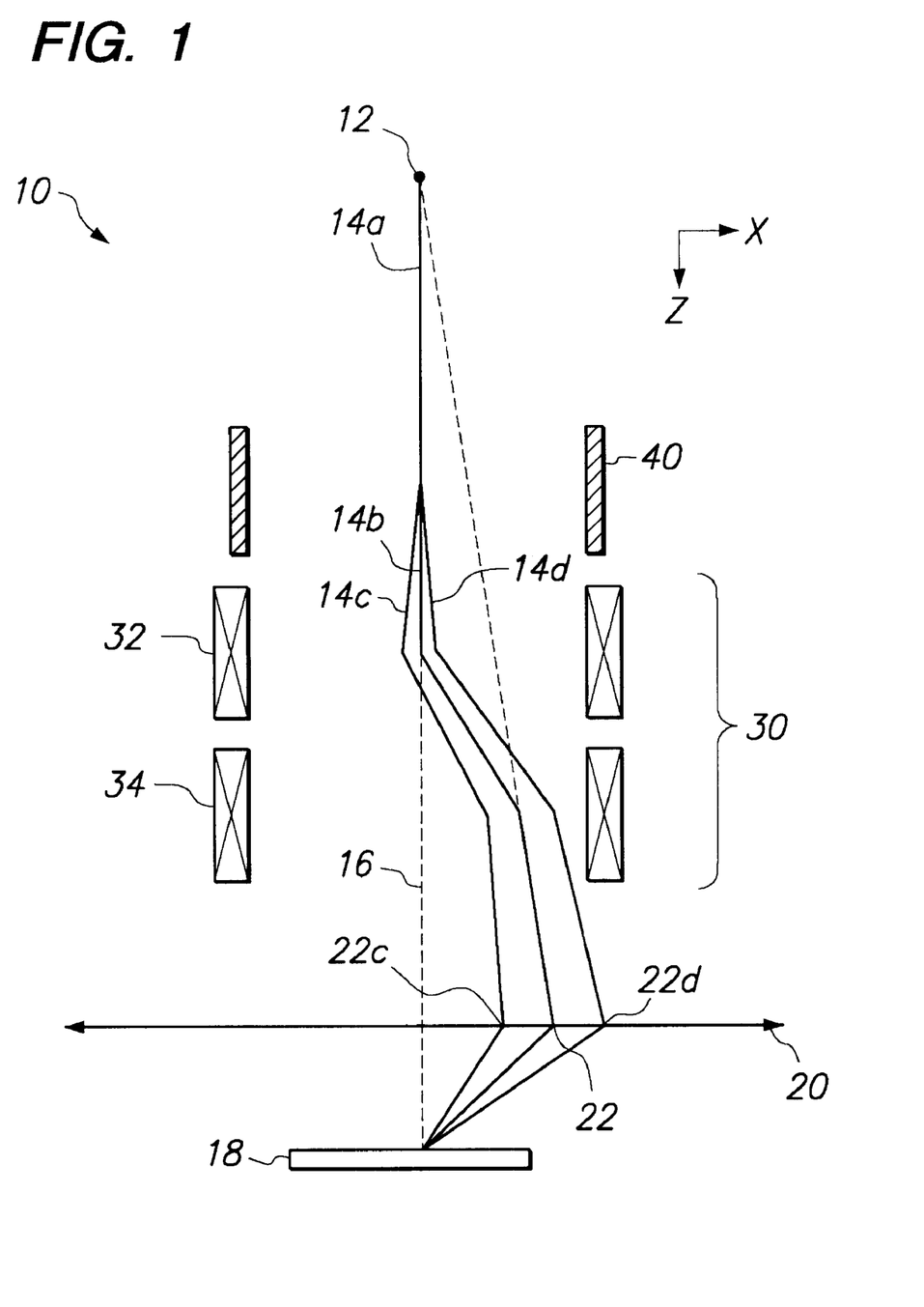
FIG. 1 is a schematic vertical cross section of a beam column according to an embodiment of the invention.

FIG. 1 illustrates a particular embodiment of a column according to the invention, generally represented by the reference numeral 10. As before, an electron beam is released from an electron source 12 and propagates on a path 14a along the optical axis 16 towards an objective lens 20 which focuses the beam onto the surface of a specimen 18. The deflection unit 30 comprises two deflectors 32, 34 to deflect the beam away from the optical axis to a path 14b which seemingly emerges from a point coincident with the apparent position of the electron source 12. Depending on the design of the column, reference sign 12 may represent the electron source itself or an intermediate image of the electron source.

In the embodiment of FIG. 1, the deflection unit 30 is arranged between the electron source 12 (or an intermediate image thereof) and the objective lens 20, i.e. deflection unit 30 is shown as a pre-lens deflection unit. However, the deflection unit 30 may also be placed in the vicinity of or even deep inside of the objective lens 20 such that their respective fields overlap.

Above the deflection unit 30, a Wien filter 40 is disposed which generates crossed electric and magnetic fields. In the embodiment of FIG. 1, where the electrons move generally in +z-direction, and the deflection unit 30 deflects the electrons in +x-direction, the electric field E is chosen along the x-axis and the magnetic field B is along the y-axis. As mentioned above, the electric and magnetic forces on the electron are then in opposite directions. Electrons with velocity v=|E|/|B| pass the filter unaffected, while electrons with a different speed experience a net force and are deflected by the Wien filter 40.

For small deflection angles, the momentum approximation can be used and the pivot point of the deflection then lies at the center of the deflection unit. Assuming that the electrons fly through a region with transverse fields with length L, the momentum transfer $p_x$ to the electrons during the time of flight through the deflection fields can be written:

$$p_x = e L (E_x/v + B_y)$$

where −e is the electron charge, $E_x$ is the electric field along the +x-axis, $B_y$ is the magnetic along the +y-axis, and v is the electron speed along the +z-axis (L. Reimer, loc. cit.). It is easily seem from the above equation, that for electrons with velocity $v_0 = E_x/-B_y$, the momentum transfer is zero, i.e. these electrons pass the filter unaffected. For the solution for $v_0$ to be meaningful (i.e. positive), $E_x$ and $B_y$ must have opposite sign, for example, the electric field may be applied along the positive x-direction and the magnetic field along the negative y-direction.

For electrons with slightly larger or smaller speeds than $v_0$ the momentum transfer leads to a deflection angle $\epsilon = p_x/p_z$. This deflection angle is positive (deflection in +x-direction, path 14d) if the electrons have a speed smaller than $v_0$, and it is negative (in −x-direction, path 14c), if the electrons are faster than $v_0$.

The off-axis path of the electron beam through the objective lens 20 causes a first chromatic aberration. The energy dispersive effect of the Wien filter 40 introduces a second chromatic aberration of the same kind as the first chromatic aberration. Appropriately choosing the strength of the electric field E and magnetic field B, the second chromatic aberration can be adjusted to have the same magnitude but opposite direction as the first chromatic aberration. In effect, the second chromatic aberration substantially compensates the first chromatic aberration in the plane of the specimen surface.

Equation (1) shows that the chromatic aberration of the objective lens 20 depends on the beam landing angle. For a different beam landing angles, the electron beam traverses the objective lens 20 generally at different distances from the optical axis 16. Thus, if in operation a change in the beam landing angle is desired, the electric and magnetic fields of the Wien filter 40 have to be set accordingly.

Figure 2:
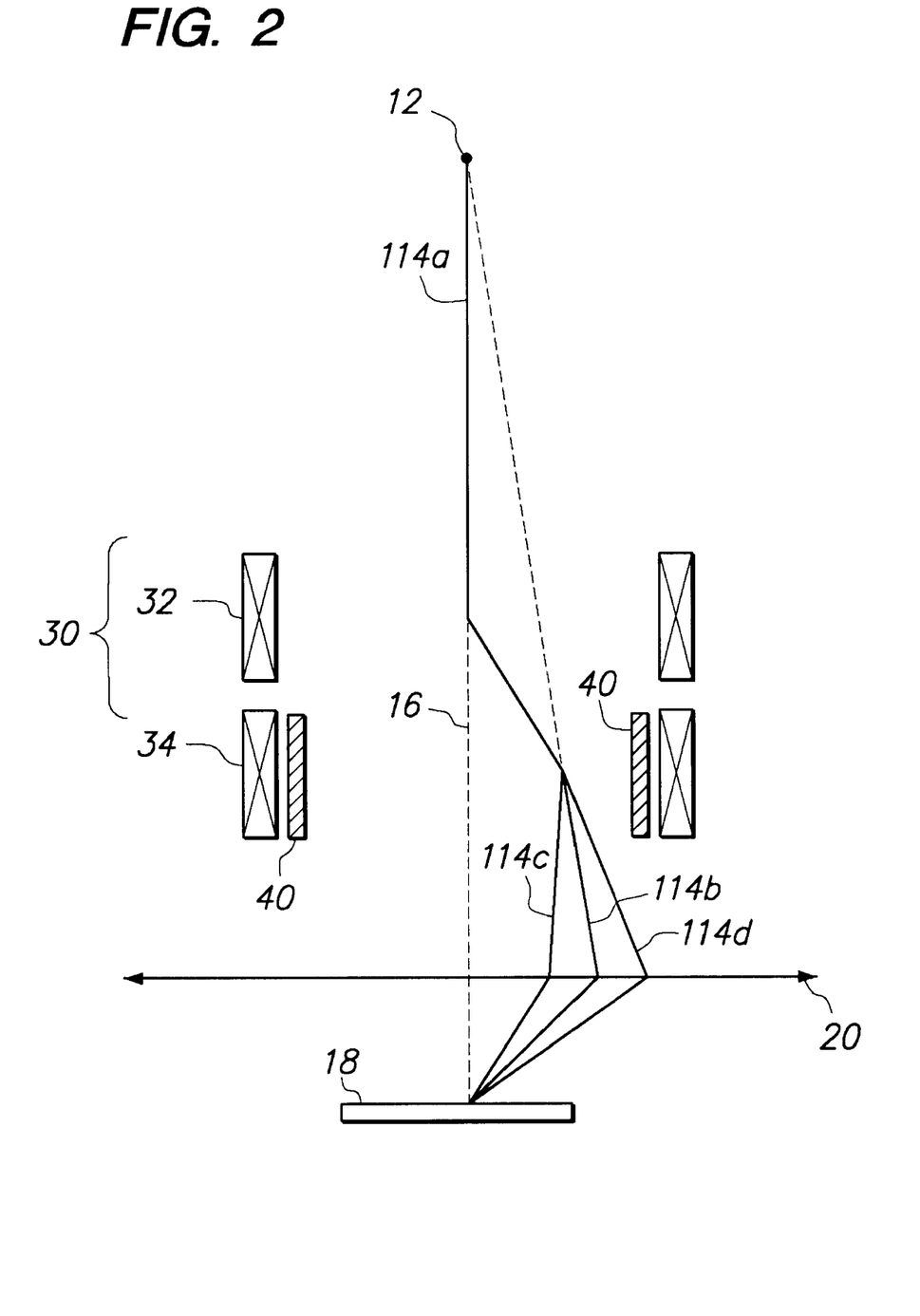
FIG. 2 is a schematic vertical cross section of a beam column according to another embodiment of the invention.

FIG. 2 shows another embodiment of the invention, wherein the Wien filter 40 is not arranged above the deflection unit 30, but within the deflection unit such that the fields of the deflection unit 30 and of the Wien filter 40 overlap. FIG. 2 shows the Wien filter 40 to be positioned at the height of the second deflection coils 34, but this is merely for ease of illustration. As in the first embodiment, the Wien filter introduces a dispersion in the beam of electrons 114a, such that faster electrons (energy E+ΔE) traverse the objective lens 20 closer to the optical axis 16 (path 114c), while slower electrons (energy E−ΔE) traverse the lens further away from the optical axis (path 114d). As the deflection of the objective lens 20 is stronger for the slower electrons, all particles are focused on the same spot on the specimen 18.

While the figures show the deflection unit 30 to comprise two deflection coils 32, 34, it is also within the scope of the invention to use a deflection unit 30 consisting of a single deflector only. For example, if reference sign 12 represents an intermediate image of the electron source, a single deflector placed at the height of the intermediate image is sufficient to deflect the beam from the optical axis 16 to a path which seems to emerges from the intermediate image of the electron source.

Figure 5A:
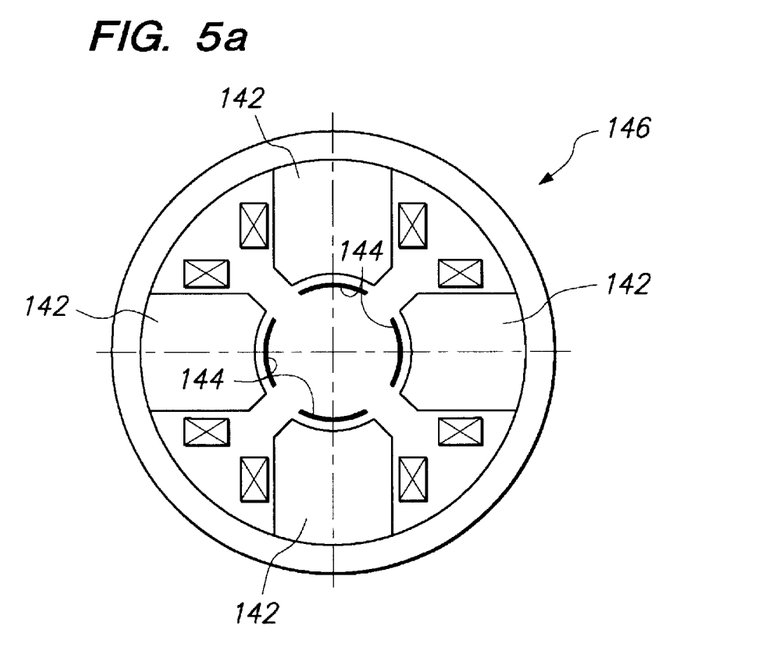
FIG. 5a is a schematic horizontal cross section of a Wien filter according to an embodiment of the invention.

FIGS. 5a,b show an embodiment of a Wien filter wherein the Wien filter forms an electrostatic and magnetic quadrupole (4-pole) 140. The quadrupole comprises four pole pieces 142 and four electrodes 144. The electrodes and pole pieces are arranged in a plane perpendicular to the optical axis 16. As best shown in FIG. 5a, the electrodes and the pole pieces are each placed along the circumference of a circle, spaced by an angle of π/2. Since the pole pieces and the corresponding electrodes have the same length (FIG. 5b) and almost the same radius (FIG. 5a), the resulting electric and magnetic field distributions are very similar, leading to a good compensations of the electric and magnetic forces for the electrons with velocity $v_0$ in any point along the optical axis of the Wien filter.

Figure 5B:
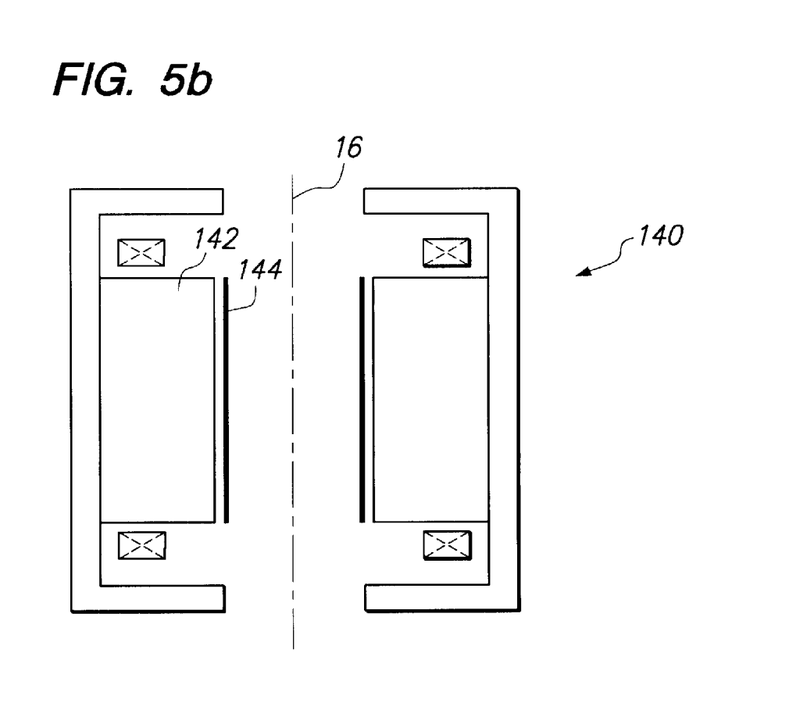

While it is not necessary that the electric and magnetic fields closely match each other, it is advantageous, because otherwise the electron beam is strongly deflected away from the optical axis before the deflection is compensated by the other kind of field, thereby introducing additional off-axis aberrations.

Using such a quadrupole arrangement, magnetic and electrostatic fields can be adjusted to deflect in an arbitrary direction in the plane perpendicular to the optical axis. Thereby, a compensation can be achieved for any direction of the deflecting action. Strong deflection fields of the Wien filter may lead to astigmatism. This astigmatism can be compensated by exciting the quadrupole (stigmator) electrostatic or magnetic field on the Wien filter.

It is also possible to create the magnetic fields without the use of pole pieces, i.e. with air coils alone. However, the match between the electrostatic and magnetic fields is then usually not as good as in the previously described case.

Figure 6A:
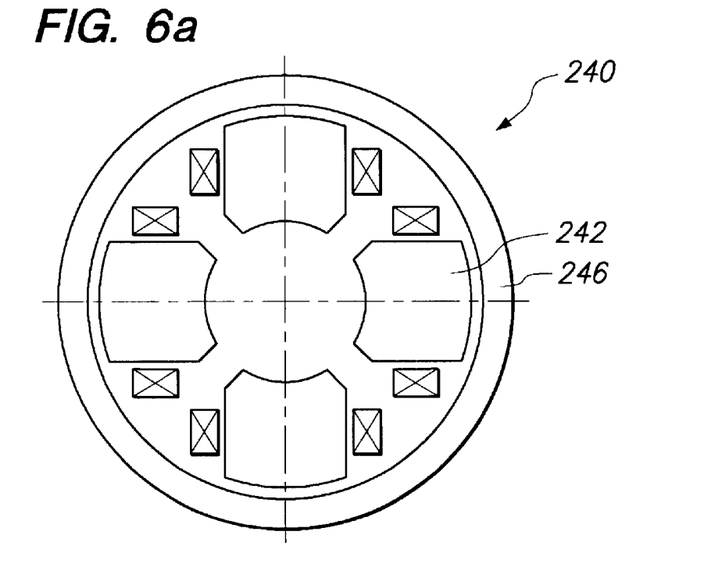
FIG. 6a is a schematic horizontal cross section of a Wien filter according to another embodiment of the invention.
Figure 6B:
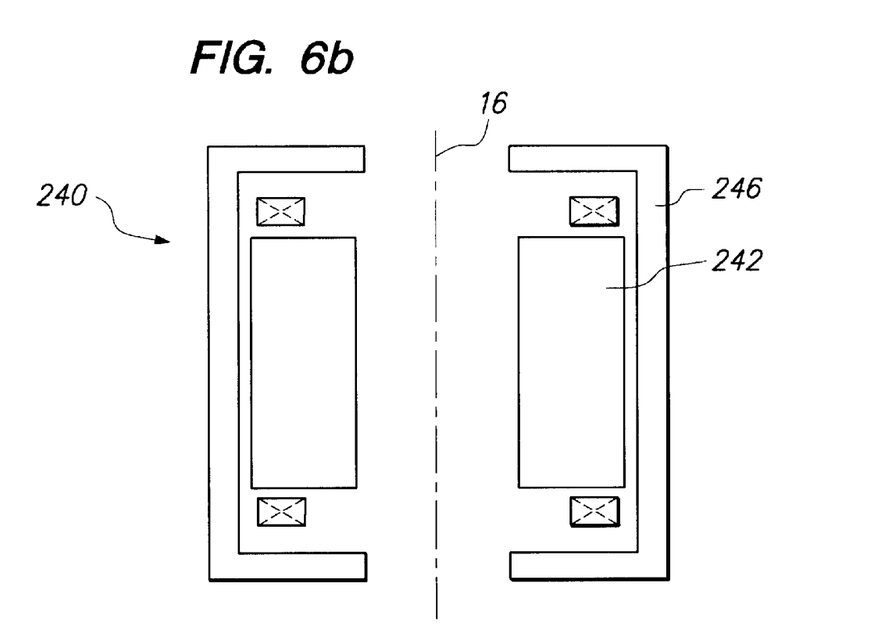

In another embodiment of the Wien filter (FIGS. 6a,b), the four pole piece 242 of an electrostatic and magnetic quadrupole 240 are electrically insulated from the magnetic circuit 246. They can therefore be used at the same time as electrodes. This has the advantage that the shape of the pole pieces and electrodes is automatically identical, leading to electric and magnetic field with substantially identical spatial distributions. The excellent matching of the respective fields is important if the deflection fields are to be very strong as then even a small misalignment of the fields may cause a large beam deflection.

Figure 7:
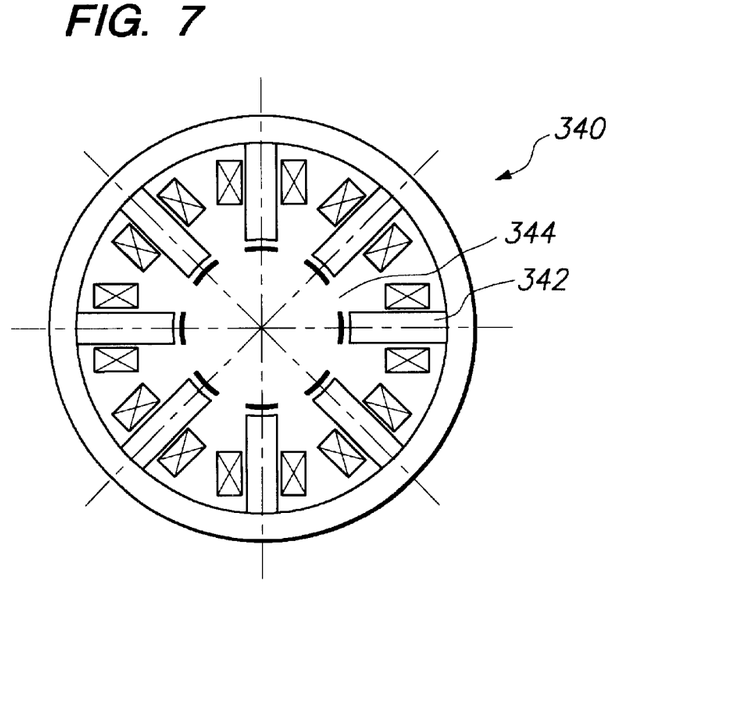
FIGS. 7–8 are horizontal cross sections of Wien filters according to further embodiment of the invention.
Figure 8:
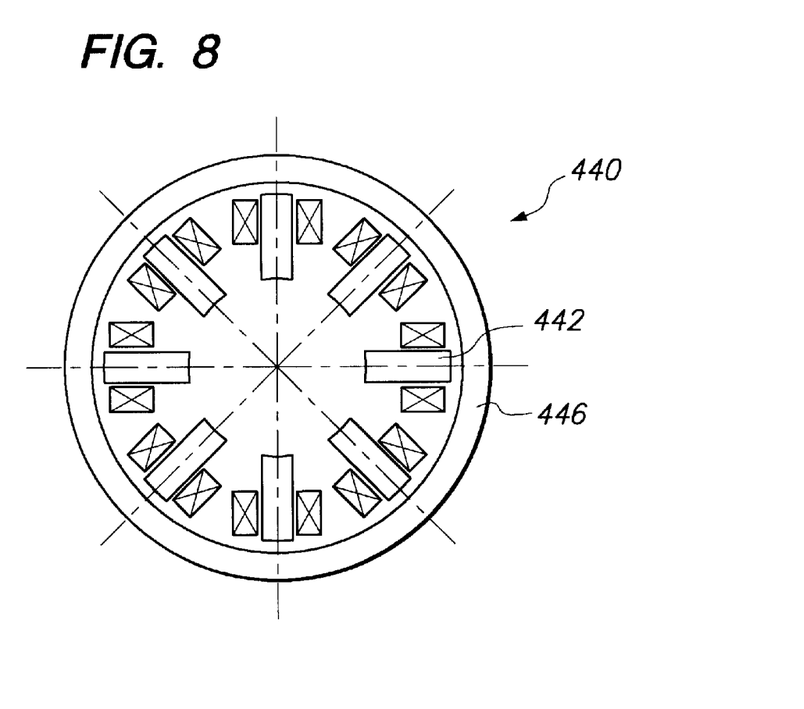

FIGS. 7 and 8 illustrate embodiments of a Wien filter wherein the Wien filter forms an electrostatic and magnetic octupole (8-pole) 340. The embodiment shown in FIG. 7 comprises eight pole pieces 342 and eight electrodes 344, arranged in a plane perpendicular to the optical axis 16 along the circumference a circle, spaced by an angle of $\pi/4$. Again, the pole pieces and the corresponding electrodes have the same length and almost the same radius (FIG. 7), to achieve electric and magnetic fields with similar spatial distributions. In the embodiment of FIG. 8, the pole pieces 442 of the electrostatic and magnetic octupole 440 are isolated from the magnetic circuit 446 to be used simultaneously as electrodes generating the electric field.

An electrostatic and magnetic octupole allows to generate more homogeneous deflection fields. This feature is especially important, if the deflection fields are to be strong, or if the diameter of the Wien filter is large, or if it is desired that the beam of charged particle can pass the Wien filter not exactly on the optical axis. Additionally, higher order deflection fields can be generated which reduce or compensate the coma of the objective lens, which forms the second largest aberration arising from the large beam landing angle. Very large beam landing angles (>15°) have thus been achieved with an excellent resolution of less than 5 nm.

Figure 9:
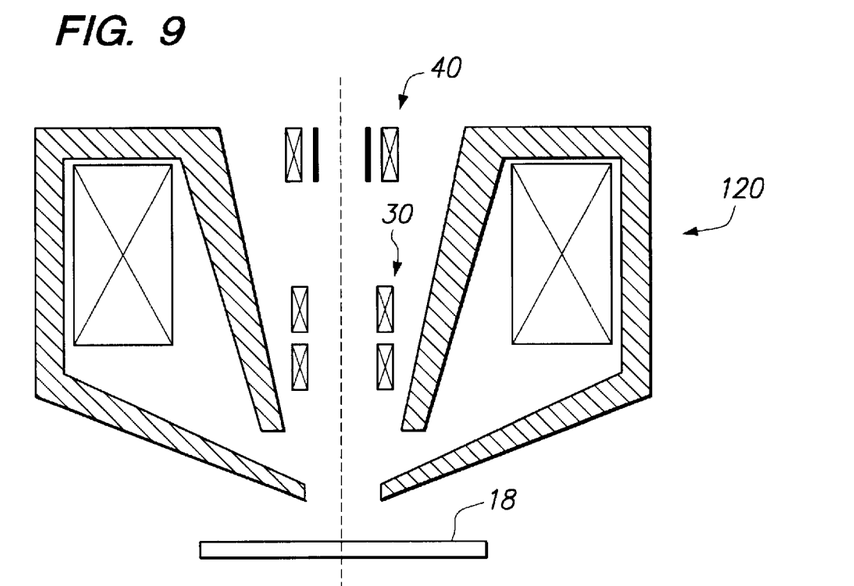
FIGS. 9–12 show vertical cross sections of the lower part of beam columns according to further advantageous embodiment of the invention.
Figure 10:
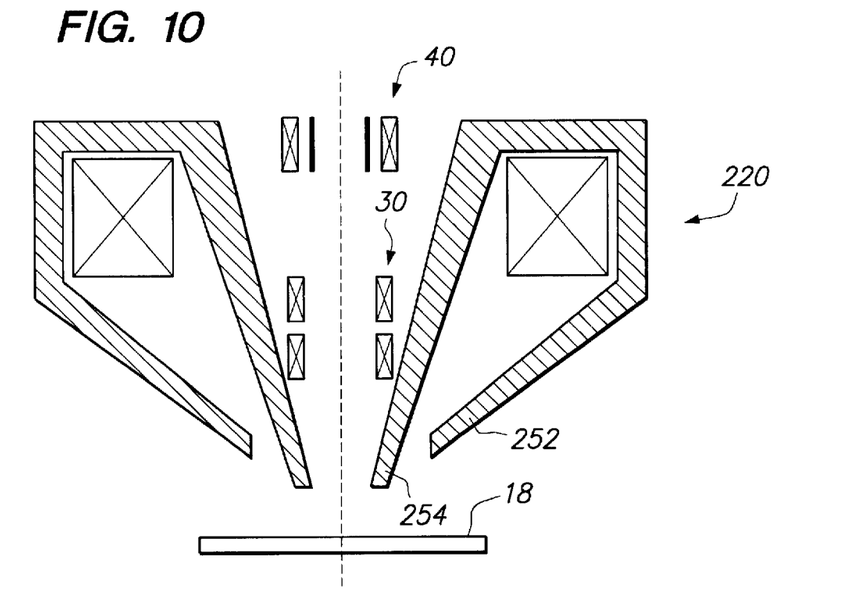
Figure 11:
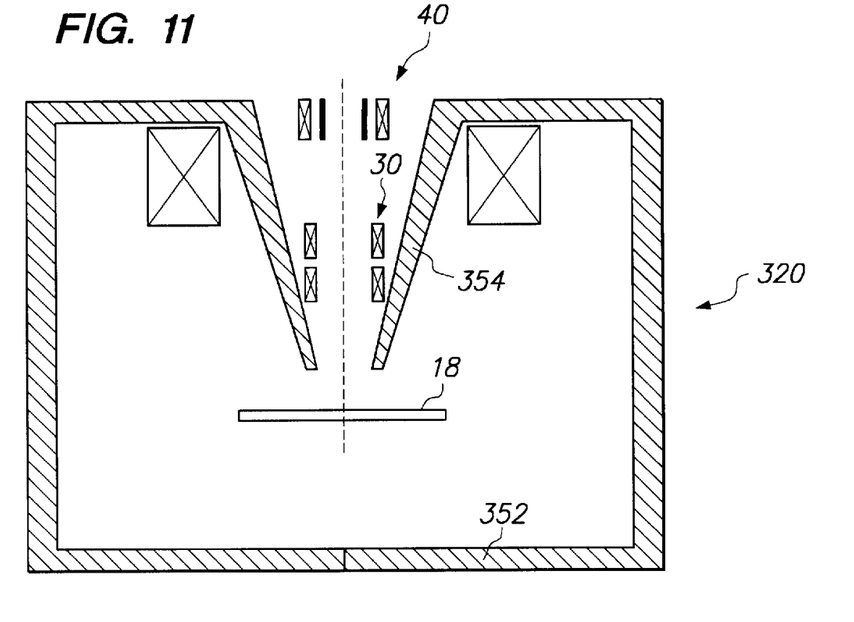

Further embodiments illustrating the invention are shown in FIGS. 9 to 12. FIG. 9 shows a Wien filter 40, for example an electrostatic and magnetic multipole according to any of FIGS. 5 to 8, arranged above deflection unit 30. The objective lens may, for example, be a single stage purely magnetic lens 120 (FIG. 9) or an immersion lens 220, where the pole pieces 252, 254 are arranged such that the specimen 18 is in or close to the region of maximum magnetic field (FIG. 10). FIG. 11 illustrates a case where the objective lens is an immersion lens 320, whose outer pole piece 352 is formed by the vacuum chamber wall.

Figure 12:
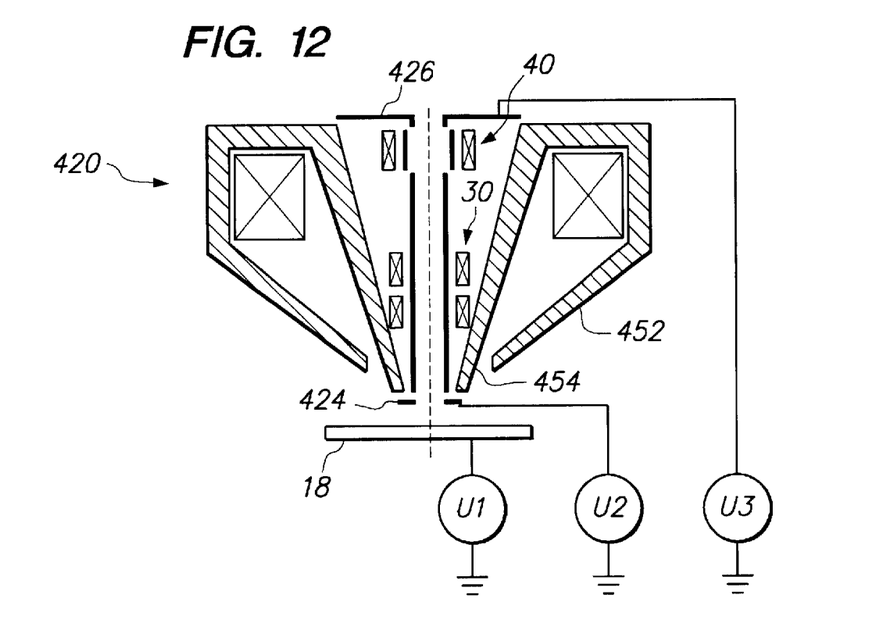

Three further embodiments for improved resolution at very low energies of about or below 1 keV are illustrated with respect to objective lens 420 in FIG. 12. In a first case, electrodes 424, 426, and the potentials U2 and U3 are absent. An electrostatic retarding field arises is created by applying a potential difference U1 between the specimen 18 and a pole piece 452, 454 of the objective lens 420.

In a second case, electrodes 424, 426 and the corresponding potentials U2 and U3 are also present to supplement the retarding field created between the specimen and a pole piece of the objective lens 420. In a third case, the means for generating potential U1 are absent. A retarding field is then created by the electrodes 424 and 426 alone. The skilled person will appreciate that one of the electrodes 424, 426 may be formed by a pole piece 452, 454 of the lens 420.

Although the magnetic part of the objective lens 420 is preferred to be an immersion lens, this needs not necessarily be the case. Any magnetic lens, especially those shown in FIGS. 9 to 11 may be combined with an electrostatic retarding lenses such as those illustrated in FIG. 12 above.

What is claimed is:

1. A column for directing a beam of charged particles with a finite energy spread onto a specimen surface under an oblique beam landing angle, the column comprising:
    a particle source for providing the beam of charged particles propagating along an optical axis;
    an objective lens for focussing the beam of charged particles onto the specimen surface;
    a deflection unit for deflecting the beam of charged particles away from the optical axis such that the beam of charged particles traverses the objective lens off-axis, thereby causing a chromatic aberration,
    a compensation unit adapted to disperse the beam of charged particles, thereby substantially compensating said chromatic aberration in the plane of the specimen surface,
    whereby the combined action of the objective lens and the deflection unit directs the beam of charged particles to hit the specimen surface under said large beam landing angle.

2. The column according to claim 1, wherein the deflection unit is adapted to provide a beam landing angle less than 25°, preferably between 3° and 15°, more preferable between 5° and 10°.

3. The column according to claim 1, wherein the deflection unit comprises two deflectors adapted to deflect the beam of charged particles away from the optical axis to a path seeming to emerge from a point coincident with the apparent position of the particle source or with an intermediate image of the particle source.

4. The column according to claim 1, wherein the compensation unit comprises means for generating crossed electrostatic and magnetic deflection fields, preferably for generating electrostatic and magnetic field perpendicular to the optical axis.

5. The column according to claim 1, wherein the compensation unit is an electrostatic and magnetic multipole (2n-pole, n=1, 2, 3, . . . ), preferably selected from the group consisting of electrostatic and magnetic dipole (2-pole), quadrupole (4-pole), hexapole (6-pole) and octupole (8-pole).

6. The column according to claim 5, wherein the electrostatic and magnetic 2n-pole comprises 2n pole pieces and 2n separate electrodes, wherein the pole pieces and the electrodes are arranged in a plane perpendicular to the optical axis.

7. The column according to claim 5, wherein the electrostatic and magnetic 2n-pole comprises 2n pole pieces, wherein each of the 2n pole pieces is adapted to be used as an electrode and wherein the pole pieces are arranged in a plane perpendicular to the optical axis.

8. The column according to claim 1, wherein the compensation unit is arranged between the particle source and the deflection unit.

9. The column according to claim 1, wherein the compensation unit is arranged within the deflection unit.

10. The column according to claim 1, wherein the objective lens is a magnetic immersion lens.

11. The column according to claim 1, wherein the objective lens is a compound magnetic-electrostatic lens, preferably where the electrostatic part of the compound magnetic-electrostatic lens is an electrostatic retarding lens.

12. The column according to claim 1, further comprising means for applying a potential difference between the specimen and a pole piece of the objective lens.

13. The column according to claim 1, further comprising means for scanning the beam of charged particles over the specimen surface.

14. A method for directing a beam of charged particles with a finite energy spread onto a specimen surface under an oblique beam landing angle, the method comprising the steps of:
    a) providing a beam of charged particles with a finite energy spread propagating along an optical axis;
    b) focussing the beam of charges particles onto the specimen surface with an objective lens;
    characterized in that the method further comprises the steps of
    c) selecting a beam landing angle;
    d) deflecting the beam of charged particles propagating along the optical axis away from the optical axis such that the beam of charged particles traverses the objective lens off-axis, thereby causing a first chromatic aberration, whereby the magnitude of the deflection is chosen such that the combined action of deflecting and focussing the beam directs the beam of charged particles to hit the specimen under said large beam landing angle;

e) dispersing the beam of charged particles, thereby introducing a second chromatic aberration of substantially the same kind and magnitude but in substantially opposite direction as said first chromatic aberration to substantially compensate said first chromatic aberration in the plane of the specimen surface.

15. The method of claim 14, wherein step e) comprises:

generating within a region along the optical axis crossed electrostatic and magnetic fields substantially perpendicular to the optical axis and to each other; and passing the beam of charged particles through said region.

* * * * *